United States Patent [19]
Itri et al.

[11] Patent Number: 5,389,893
[45] Date of Patent: Feb. 14, 1995

[54] CIRCUIT FOR A CONTROLLABLE AMPLIFIER

[75] Inventors: Sossio Itri, Wolfsburg; Martin Rieger, Rottweil, both of Germany

[73] Assignee: Deutsche Thomson-Brandt GmbH, Villingen-Schwenningen, Germany

[21] Appl. No.: 138,852

[22] Filed: Oct. 19, 1993

[30] Foreign Application Priority Data

Apr. 25, 1991 [DE] Germany ............................ 4113498

[51] Int. Cl.$^6$ ............................................. H03F 3/45
[52] U.S. Cl. ........................................ 330/254; 330/261
[58] Field of Search ............... 330/252, 254, 261, 278, 330/285

[56] References Cited

U.S. PATENT DOCUMENTS

| | | | |
|---|---|---|---|
| H965 | 9/1991 | Davis et al. | 330/254 |
| 4,429,416 | 1/1984 | Page | 455/211 |
| 5,313,172 | 5/1994 | Vagher | 330/254 |

FOREIGN PATENT DOCUMENTS 3522416  1/1987  Germany.

Primary Examiner—Steven Mottola
Attorney, Agent, or Firm—Joseph S. Tripoli; Peter M. Emanuel; Richard G. Coalter

[57] ABSTRACT

To improve the regulation (gain control) characteristics of a controllable amplifier, a negative feedback network in a differential amplifier is subdivided into individual networks supplied each with its own control current. In order to reduce distortion caused by non-linear sections contained in the networks or to increase intermodulation resistance, the individual control currents are reduced with an increasing input voltage. To obtain a dB-linear regulation characteristic the control currents may be proportioned, for example, in accordance with tangential-hyperbolic characteristic curves.

12 Claims, 5 Drawing Sheets

CIRCUIT FOR A CONTROLLABLE AMPLIFIER

CROSS-REFERENCE TO RELATED APPLICATIONS

This application is a continuation of PCT application Ser. No. PCT/EP 92/00912 filed Apr. 25, 1992, by Sossio Itri and Martin Rieger and entitled CIRCUIT FOR A CONTROLLABLE AMPLIFIER.

FIELD OF THE INVENTION

The invention relates to electrical circuits and particularly to circuits for controlling the gain of amplifiers.

BACKGROUND OF THE INVENTION

There are controllable amplifiers known which, for example, are used for amplitude control (regulation) of IF signals. Such an amplifier is contained, for example, in the integrated circuit type TDA 4443. However, these known amplifiers are not of the low-noise type or have limited linearity or the regulation characteristic is not dB-linear.

SUMMARY OF THE INVENTION

The present invention is directed to meeting the need for a circuit for a controllable amplifier with increased linearity and improved noise characteristics.

A circuit, embodying the invention, is provided with a differential amplifier for an input voltage, the amplifier containing a first transistor and a second transistor connected by a series connection of at least three resistors. In accordance with an aspect of the invention, at least one component branches off each between these resistors which component is connected respectively to at least one current source, and the current of these current sources can be altered depending on the input voltage.

In an advantageous way, particularly with a dB-linear regulation, the current of the current sources is hereby additionally dependent upon a reference voltage. The reference voltages are selected such that the respective reference voltage is lowest for the components located in the center of the series connection and highest for the components nearest the ends of the series connection. As used herein, the term "dB-linear" has its customary meaning that the circuit gain, expressed in decibels, is a linear function of the control variable (e.g., voltage or current) applied to control the circuit gain. Advantageously, with linear regulation, the currents of the current sources are proportional to each other and become smaller from the center towards the ends of the series connection.

In accordance with another aspect of the invention, in a differential amplifier, the entire feedback network is subdivided into individual networks which are each supplied with at least one own control current. In order to keep distortions through nonlinear components contained in the networks, for example, diode sections, low, or rather to raise intermodulation stability, the individual control currents become smaller as the input voltage increases. For realizing a dB-linear regulation characteristic, the control currents can be given, for example, tanh (hyperbolic tangent) shaped or similar characteristic curve. In addition, such an amplifier is relatively low in noise owing to its construction and operational principle.

BRIEF DESCRIPTION OF THE DRAWING

The foregoing and further features of the invention are illustrated in the accompanying drawing wherein like elements are denoted by like reference designators and in which.

DETAILED DESCRIPTION

Figure 1:
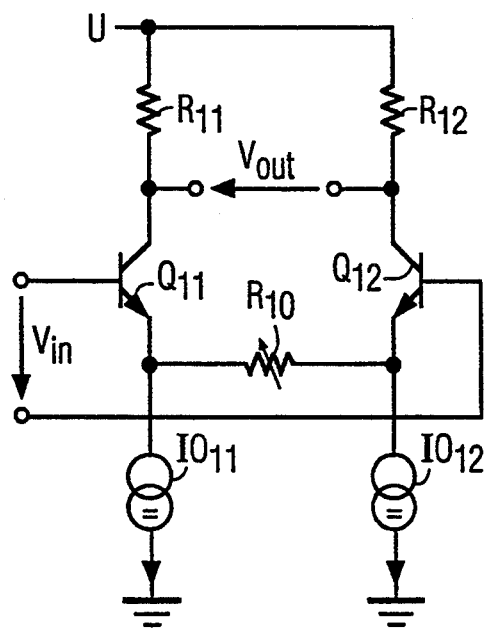
FIG. 1 (Prior Art) is a circuit diagram of a known circuit for a controllable amplifier.

The known controllable gain amplifier circuit of FIG. 1 contains a first transistor $Q_{11}$ and a second transistor $Q_{12}$ which are wired as a differential amplifier. The collectors of these transistors are connected via a first resistor $R_{11}$ or second resistor $R_{12}$ respectively to the supply voltage U. The emitters of these transistors are connected via a first current source $IO_{11}$ or second current source $IO_{12}$ respectively to ground. The bases of the two transistors are fed with the input voltage Vin. The output voltage Vout can be picked up between the collectors of the two transistors.

Variable gain control in the known circuit is provided by a variable (controllable) resistor $R_{10}$ connected between the emitters of the two transistors. Adjustment of the value of this resistor (as indicated by the arrow) can be used to adjust the amplification of the circuit. If $R_{11}=R_{12}=R$ and $IO_{11}=IO_{12}=IO$ then the output voltage will be directly proportional to the input voltage times the value of resistor R and inversely proportional to the value of the emitter coupling resistor $R_{10}$ (i.e., Vout=Vin * R/$R_{10}$).

Figure 2:
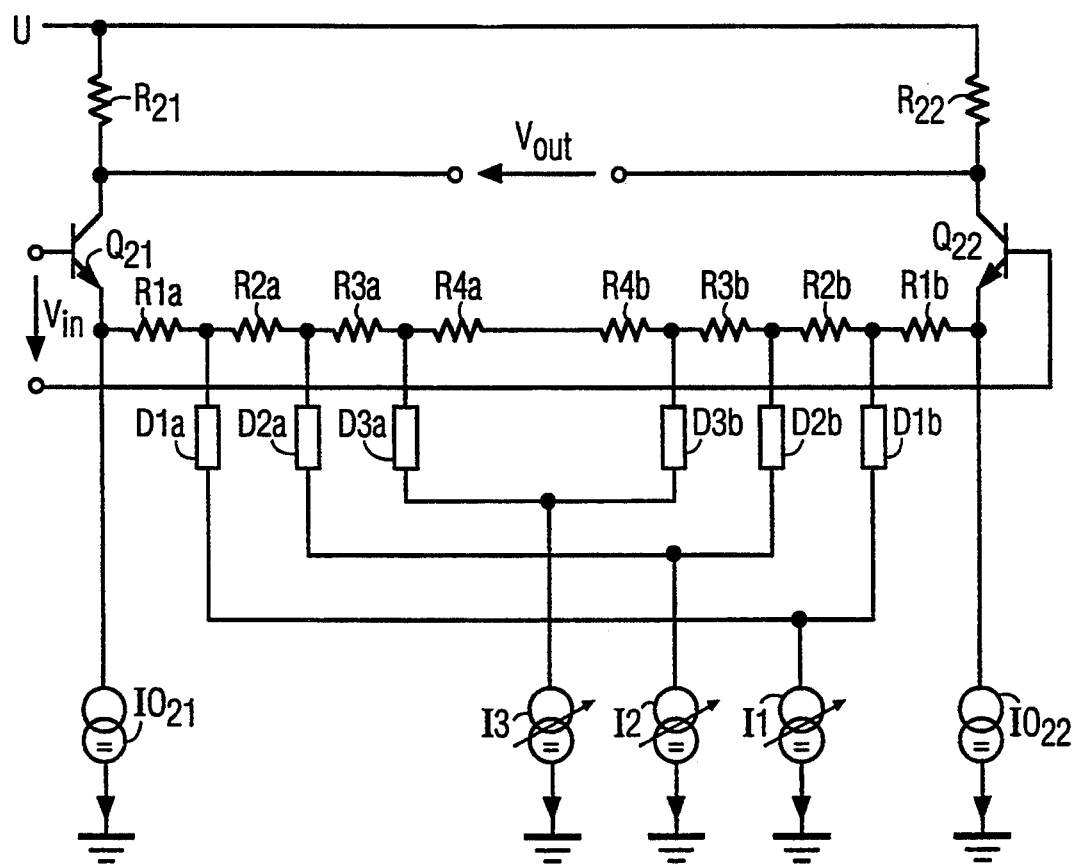
FIG. 2 is a circuit diagram of a controllable amplifier including a gain controlling circuit according to the invention.

The controllable gain amplifier of FIG. 2, embodying the invention, contains a network consisting of eight resistors R1a through R4a and R1b through R4b wired in series, six components D1a through D3a and D1b through D3b branching off always between there resistors, and three current sources I1 through I3 clamped to ground on one side and connected to these components. This network replaces the controllable resistor R10 of FIG. 1 and provides for gain control in accordance with the invention.

The six "components" used in the example of FIG. 2 in the network are variable impedance devices such as, for example, diodes or field effect transistors. In the case of a bipolar circuit, the six components may be diodes, the conducting direction of which points towards the current sources I1 through I3. The alternating current resistance of theses diodes is equal to Vt/I in this case, where Vt is the temperature voltage (equivalent) or device "threshold voltage" and I is the current flowing through the diode. In the case of a MOS transistor circuit, the six components can be variable resistors in the form of FET transistors. In particular, linear resistors of this type can be attained by combining N-MOS and P-MOS transistors.

In the example of the invention of FIG. 2 the circuit parts $Q_{21}$, $Q_{22}$, $R_{21}$, $R_{22}$, $IO_{21}$ and $IO_{22}$ correspond to the circuit parts $Q_{11}$, $Q_{12}$, $R_{11}$, $R_{12}$, $IO_{11}$ and $IO_{12}$ of FIG. 1. The difference lies in the implementation of the emitter coupling circuit elements as described above. The number of circuit parts replacing resistor R10 or rather the number of divider stages wired in series may be varied in accordance with the requirements for the range of control taking into account the size of the operating voltage available.

In operation of the example of FIG. 2, if, starting at a low level, the input voltage Vin climbs, then the current in the current source I1 is lowered at first. Thereby, the (variable impedance) component (the diode or transistor, as noted above) D1a or D1b respectively becomes highly resistant. As a result, the influence of possible distortions, caused by high levels at D1a or D1b respectively, upon the total distortions of the amplifier become negligible, and the amplification is reduced accordingly. The components R1a and R2a or, respectively, R1b and R2b now function, for the component D2a or D2b respectively, like a voltage divider with an increased division ratio so that, with reference to D2a or D2b respectively, higher levels are permissible for input voltage Vin. This procedure continues for further increasing input voltages for the corresponding following components.

For example, the following dimension parameters can be taken:

$R_{21} = R_{22} = 3.9$ kOhm
$R1a = R1b = 100$ Ohm
$R2a = R2b = 1.38$ kOhm
$R3a = R3b = 1.26$ kOhm
$R4a = R4b = 1.26$ kOhm

Figure 3:
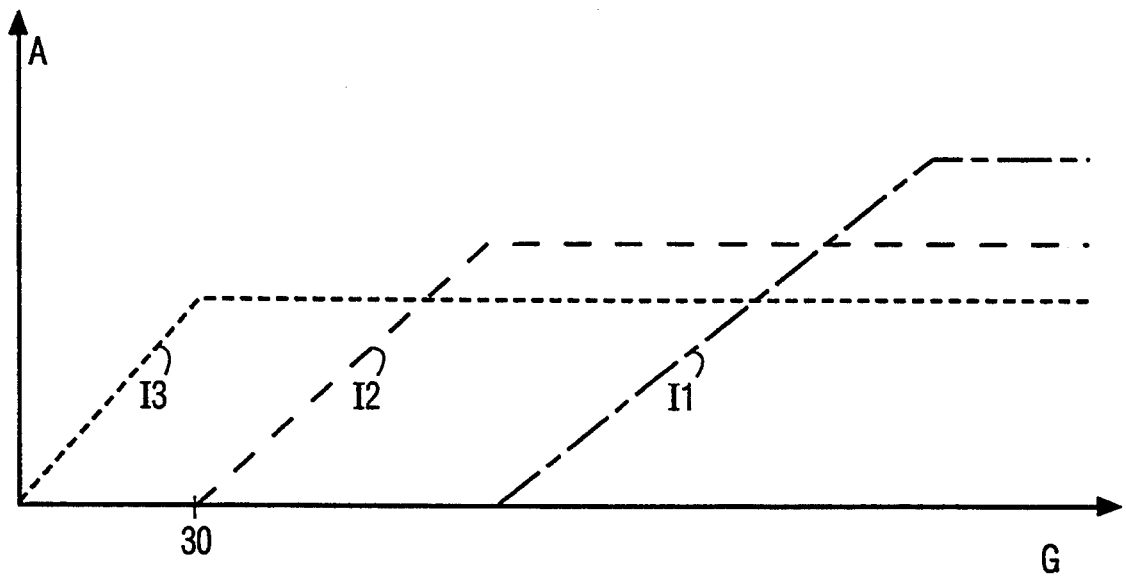
FIG. 3 is a diagram illustrating control current characteristic curves for the amplifier of FIG. 2.

FIG. 3 illustrates the amplitude progression 'A' of the control currents for current sources I1, I2 and I3 above the amplification G. With greater amplification (i.e. decreasing amplification), control current from current source I1 is lowered at first. At the latest when this control current has become zero, the control current from current source I2 drops. At the latest when this control current has become zero, the control current from current source I3 drops. When this control current has become zero, minimum amplification is then present. The same applies to possible further control currents. In this manner, the output voltage Vout can be held constant within the range of control of the amplifier independently of the level of the input voltage Vin, whereby the linearity within this range of control is clearly increased with respect to the known gain control amplifier.

It is a further advantageous feature of the invention that the regulation characteristic of the amplifier in FIG. 2 can be correspondingly influenced by the course of the control currents from current sources I1 through I3. A higher maximum amplification can be achieved by using a higher control current. The number of control currents can be matched to the respective requirements of the total range of control and the linearity, but an increasing number of control currents or increasing size of the control currents also requires a correspondingly increased operating voltage U. With reference to FIG. 3, the amplification factor 30, at the point where the control current from current source I2 has become zero and control current from current source I3 just starts to drop, as well as the corresponding amplification factors for the other currents can be determined by reference voltages fed to the respective current source I1, I2 and I3.

An IF amplifier has, for example, a range of control of 60 dB. If, for example, with control voltage $V_{AGC}$, an amplification of 6 dB is to be set, this control voltage, with a linear regulation characteristic comes to only:

$V_{AGC6dB} = (2/1000) * V_{AGCmax}$ (6dB = factor 2, 60dB = factor 1000).

In contrast, with a dB-linear characteristic, the following control voltage would result:

$V_{AGC6dB} = (6/60) * V_{AGCmax}$.

A "dB-linear" characteristic, as previously noted, is one wherein gain expressed in decibels (e.g., dB, a logarithmic unit) varies linearly with changes in the control signal (voltage or current). This is why a dB-linear regulation characteristic has advantages with regard to the simplicity of regulation, the speed of regulation and the stability of regulation (regulation jumps).

Figure 4:
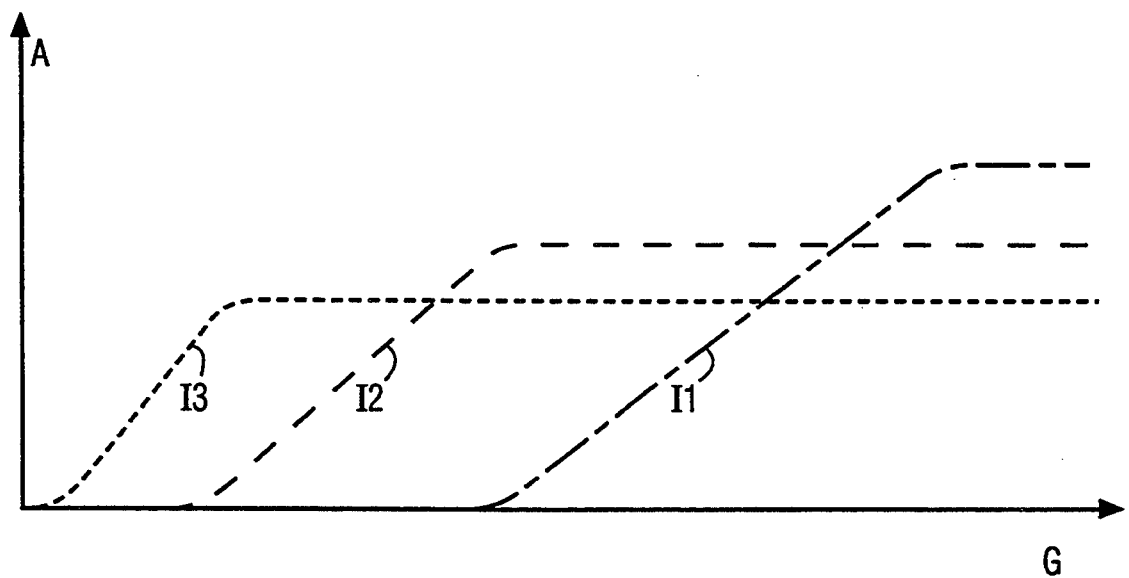
FIG. 4 is a diagram illustrating control current characteristic curves for a dB-linear regulation characteristic for the amplifier of FIG. 2.

Advantageously, the circuit according to the invention allows such a dB-linear regulation characteristic to be achieved easily. A correspondingly improved amplitude progression 'A' of the control currents for current sources I1, I2, and I3 above the amplification G is indicated in FIG. 4. The individual characteristic curves exhibit a course similar to a tanh (hyperbolic tangent). The statements made with respect to FIG. 3 also apply here accordingly.

Figure 5:
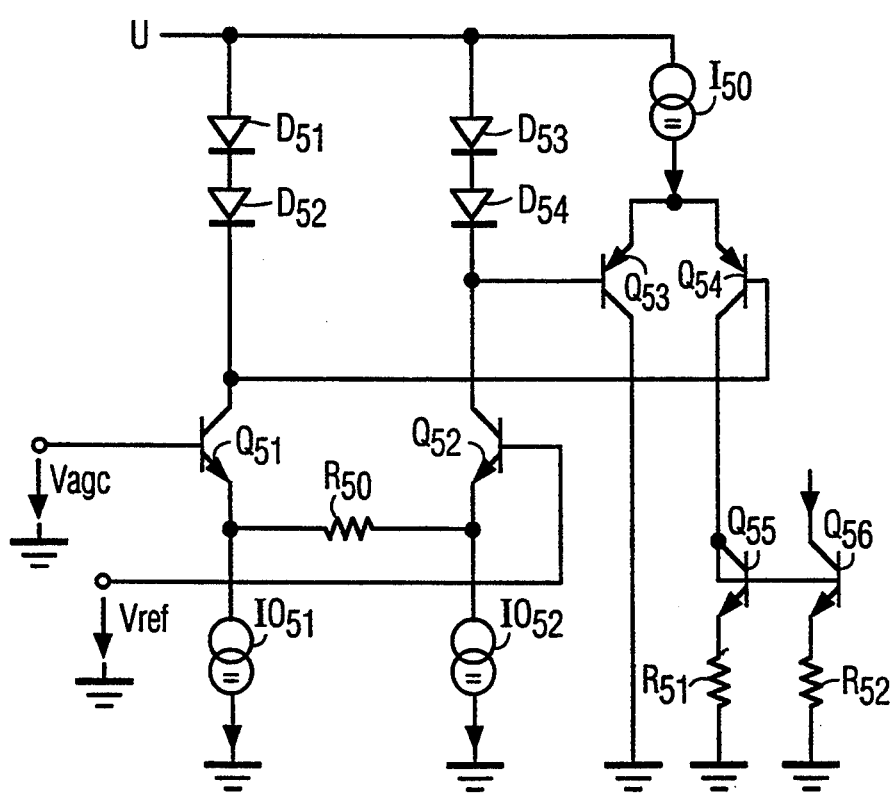
FIG. 5 is a schematic diagram of a circuit for generating control currents having characteristic curves in accordance with the diagram of FIG. 4.

A current source I1, I2, or I3, having a characteristic curve corresponding to that of FIG. 4, can be realized using a current source circuit according to FIG. 5. The three current source circuits are each fed with the common control voltage $V_{AGC}$ and an individual reference voltage $V_{REF}$. The control voltage $V_{AGC}$ and the reference voltage $V_{REF}$ are sent to two differential amplifier transistors $Q_{51}$ and $Q_{52}$ respectively, the emitters of which are connected to each other via a resistor $R_{50}$ and each connected to ground via a current source $IO_{51}$ and $IO_{52}$ respectively. The collector of $Q_{51}$ is connected via two diodes $D_{51}$ and $D_{52}$ and the collector of $Q_{52}$ is connected via two diodes $D_{53}$ and $D_{54}$ to the operating voltage U. The voltage difference between the two collectors is applied to the base terminals of a further differential amplifier transistor pair $Q_{53}$ and $Q_{54}$ and, consequently, controlled depending on the differential amplifier with the transistors $Q_{51}$ and $Q_{52}$. The emitters of $Q_{53}$ and $Q_{54}$ are connected via a third current source $I_{50}$ to the operating voltage. The collector of $Q_{53}$ is connected to ground. The collector of $Q_{54}$ is connected to the base and collector of a fifth transistor $Q_{55}$, the emitter of which is connected via a second resistor $R_{51}$ to ground and the base of which is connected to the base of a sixth transistor $Q_{56}$. The emitter of the sixth transistor is connected via a third resistor $R_{52}$ to ground. The respective control current from the current source I1, I2, or I3 can be picked up at the collector. Let it be assumed that $v = (V_{AGC} - V_{ref})$, IO is the (load independent) current impressed by the current sources $IO_{51}$ and $IO_{52}$, and $IO_{50}$ is the current impressed by current source $I_{50}$. Then, the respective resulting output current $I_{out}$ may be expressed as:

$$I_n = C*IO_{50}*(1/(1+((I_O+v/R_{50})/I_O-v/R50))^k))$$

where n is the index of the respective characteristic curve (n=1, 2, 3), k is the number of diodes wired in series, and C is a constant, for example, C=3. Therefore, in the current source circuit according to FIG. 5, k=2. The respective gradient of the control current is given by $IO_{50}$.

Figure 6:
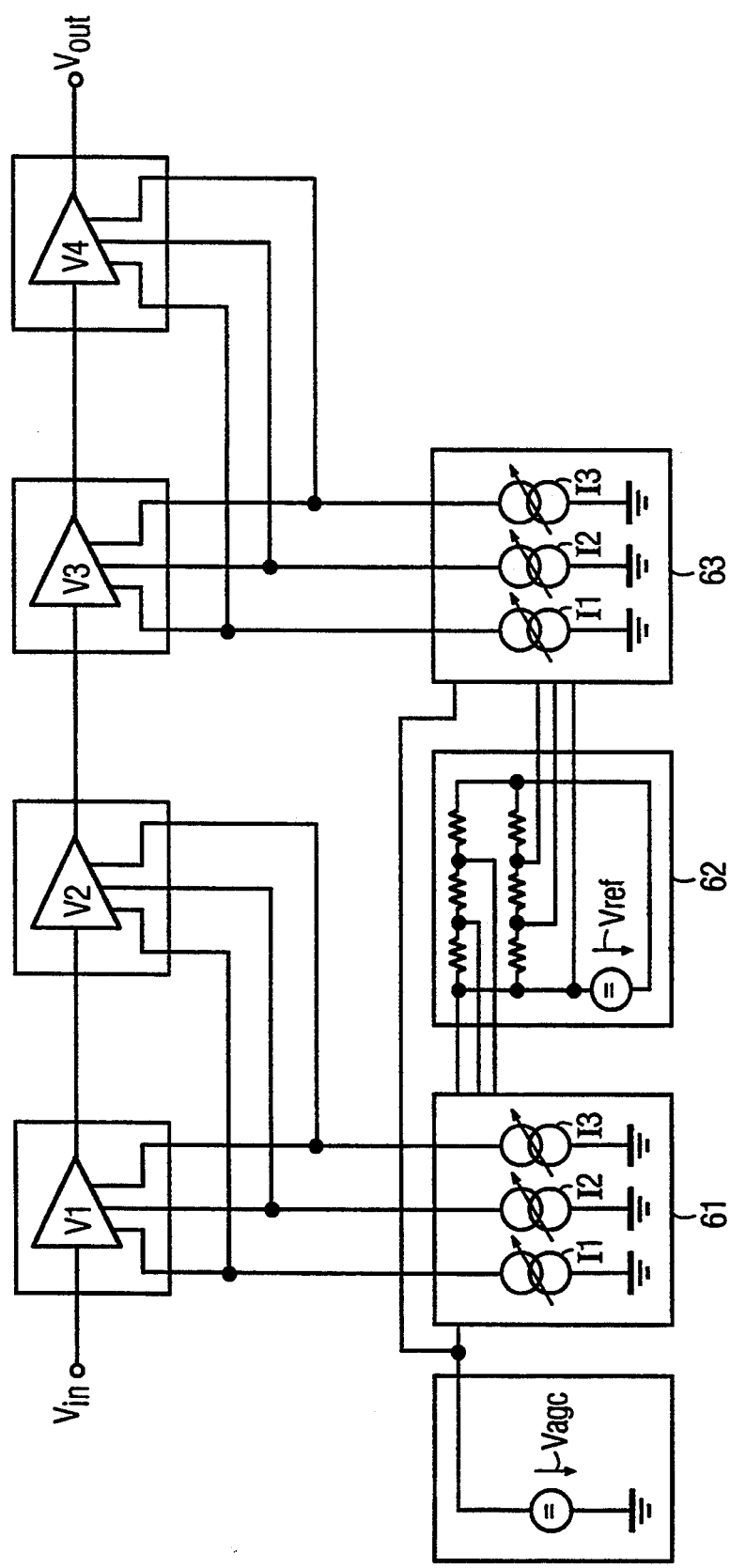
FIG. 6 is a block diagram, partially in schematic form of a variable gain amplifier block including several individual amplifiers embodying the invention.

The foregoing is applied in the example of a three stage controlled amplifier shown in FIG. 6. The following dimensioning parameters may be taken for the first current source block 61:

U=7.7 V, current source I1:
  $R_{50}$=8.0 kOhm
  $R_{51}$=$R_{52}$=2.7 kOhm
  Io=167 microA
  current from $I_{50}$=103 microA
  Vref=3.624 V
current source I2:
  $R_{50}$=10.0 kOhm
  $R_{51}$=$R_{52}$=2.25 kOhm
  Io=50.6 microA
  current from $I_{50}$=103 microA
  Vref=3.624 V
current source I3:
  $R_{50}$=4.0 kOhm
  $R_{51}$=$R_{52}$=1.5 kOhm
  Io=50.5 microA
  current from $I_{50}$=103 microA
  Vref=2.179 V The following illustrative dimensions are those which differ for the second current source block 63 described in FIG.

current source I1:
  Io=169 microA
  $V_{ref}$=5.67 V
current source I2:
  Io=51.4 microA
  $V_{ref}$=4.766 V
current source I3:
  Io=51.3 microA
  $V_{ref}$=4.326 V The IF amplifier block in FIG. 6 contains four individual amplifiers V1 through V4, each of which corresponds to a controllable amplifier according to FIG. 2. The control currents required by these controllable amplifiers are supplied by six current source circuits according to FIG. 5, the first three of which are combined to form a first current source block 61 and the other three combined to form a second current source block 63. The first current source block 61 controls the first V1 and second V2 individual amplifier. The number of current source blocks can lie between one and four according to the quality of regulation demanded. Each current source block corresponds to three current source circuits according to FIG. 5. The current source blocks receive the common control voltage $V_{AGC}$ but individual reference voltages from the reference voltage block 62.

Advantageously, the gain control amplifiers wired in series can form the main part of an integrated IF amplifier circuit.

Figure 7:
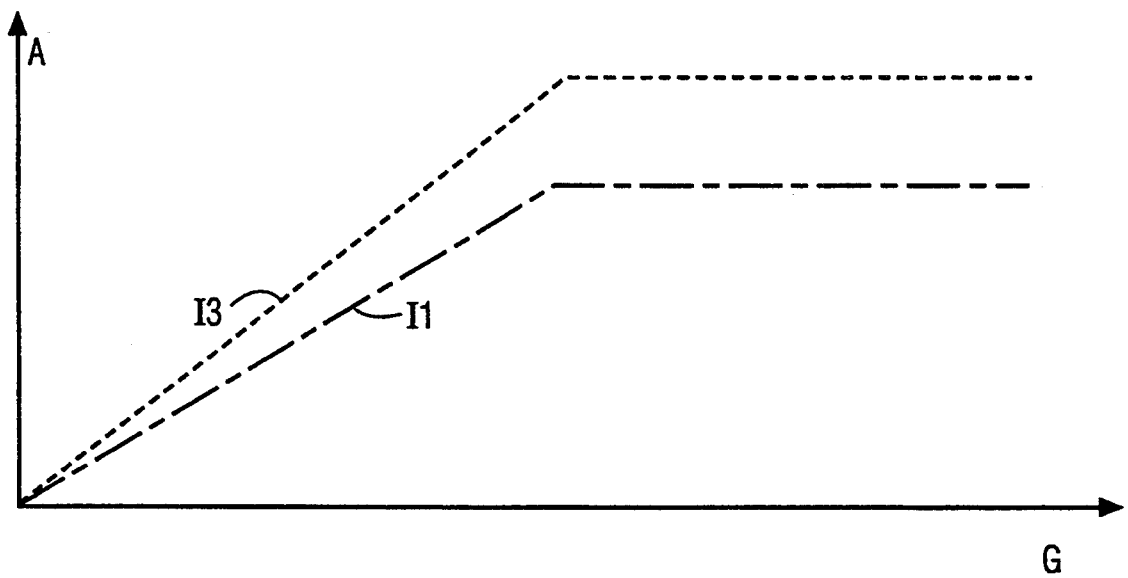
FIG. 7 is a diagram illustrating control current characteristic curves for providing a linear regulation characteristic when using two control currents in the amplifier of FIG. 2.

When triggering using only two control currents according to FIG. 7, a linear regulation characteristic can be attained. For example, the following dimensioning parameters can be taken for this in FIG. 2:

$R_{21}$=$R_{22}$=3.0 kOhm
R1a=R1b=100 Ohm
R3a=R3b=2.486 kOhm
R4a=R4b=158 Ohm
R2a, R2b and I2 are omitted.

Figure 8:
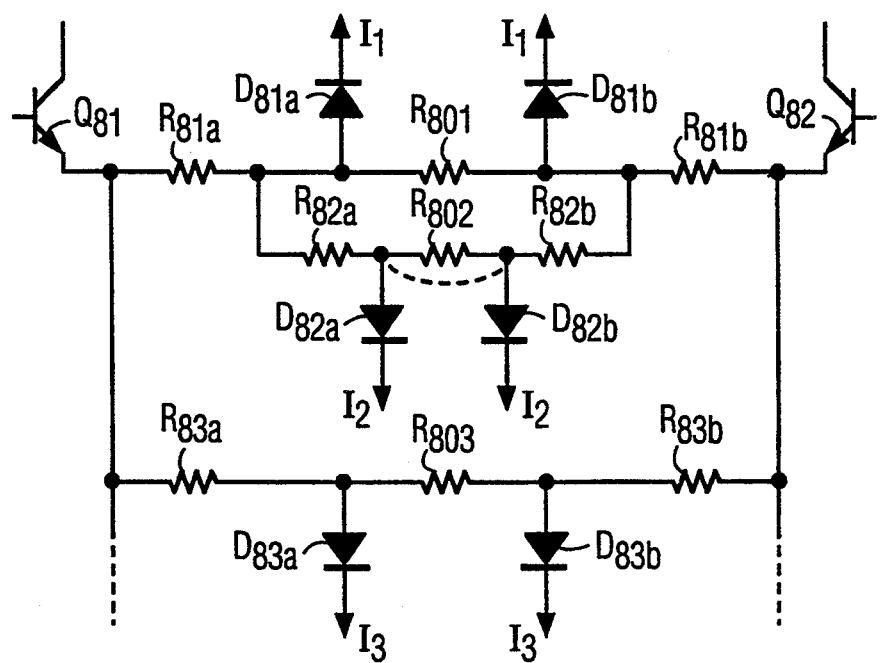
FIG. 8 is a schematic diagram of an alternative network embodying the invention and suitable for use in the example of FIG. 2.

FIG. 8 illustrates a modification of the embodiment of the invention of FIG. 2. Recall that in FIG. 2 the gain controlling network comprises eight resistors R1a through R4a and R1b through R4b wired in series, six components D1a through D3a and D1b through D3b branching off always between these resistors, and three current sources I1 through I3 leading to ground on one side and connected to these components. In the alternative embodiment of FIG. 8 the gain controlling circuit (network), disposed in series between the emitters of transistors Q81 and Q82, corresponding to transistors Q21 and Q22, comprises the following elements:

resistors $R_{81a}$, $R_{801}$, $R_{81b}$ with diodes $D_{81a}$ and $D_{81b}$ branching off between these which are connected to current sources I1;

resistors $R_{83a}$, $R_{803}$, $R_{83b}$ with diodes $D_{83a}$ and $D_{83b}$ branching off between these which are connected to current sources I3; and resistors $R_{82a}$, $R_{802}$, $R_{82b}$ with diodes $D_{82a}$ and $D_{82b}$ branching off between these which are connected to current sources I2, whereby resistors $R_{82a}$ and $R_{82b}$ are connected to resistors $R_{81a}$ through $R_{801}$ and $R_{81b}$ through $R_{801}$ respectively instead of being connected directly to the emitters of the two transistors $Q_{81}$ and $Q_{82}$.

Further corresponding components and current sources may be connected parallel to R802 as indicated by the dotted (phantom) line.

Operation of the example of FIG. 8 is similar to that of FIG. 2 and this version may be used in the IF amplifier of FIG. 6. An advantage of the embodiment of FIG. 7 is that the different topology results in a substantial reduction in the number of resistors required. This is an important consideration when the amplifier is implemented in an integrated circuit because resistors generally require relatively large amounts of semiconductor surface area for fabrication and reducing this area tends to improve fabrication yields.

What is claimed is:

1. A circuit for a controllable amplifier, provided with a differential amplifier for an input voltage, said differential amplifier containing a first transistor and a second transistor, the emitters of said transistors being connected by resistors, and wherein:

said emitters of said first and second transistors are connected by a series circuit of at least three resistors;

wherein a respective component whose resistance can be controlled is branched off between said resistors, each of said components being connected to a respective current source;

wherein the current from said current sources can be altered in dependence on the input voltage, and wherein, in the event that the middle resistor of the resistors in the series circuit is divided into two individual resistors, no component having a controllable resistance is branched off from the junction of these two resistors.

2. A circuit according to claim 1, wherein:

said current from said current sources is additionally dependent upon a reference voltage: and wherein said reference voltage being lowest for the components whose resistance can be controlled located in the center of the series circuit and being highest for the components whose resistance can be controlled located nearest to the ends of the series circuit.

3. A circuit according to claim 1 wherein said components whose resistance can be controlled are a selected one of (i) semiconductor diodes and (ii) field effect transistors formed as current controlled resistors.

4. A circuit according to claim 1 wherein the amplitude versus gain characteristic curves of the currents from the current sources each consist of a rising section and of a level section, wherein the rising section of the following amplitude versus gain characteristic curve always begins at the latest at the end of the rising section of a previous curve, and wherein the respective reference voltage determines the beginning and/or end of the rising section of the characteristic curve.

5. A circuit according to claim 1 wherein the amplitude versus gain characteristic curves of the currents from the current sources have a respective shape which, in essence, is similar to a hyperbolic tangent.

6. A circuit according to claim 1, characterized in that, the regulating characteristic for the controllable amplifier is selected to be essentially dB-linear or linear.

7. A circuit according to claim 1 wherein the flat section of the characteristic curve is the lowest for the components whose resistance can be controlled located in the center of the series circuit and is higher for the components whose resistance can be controlled located nearer to the respective ends of the series circuit.

8. A circuit according to claim 1 wherein a plurality of said controllable amplifiers are connected in series and wherein the reference voltages for subsequent amplifiers in the series connection are selected to be always higher than for the preceding one.

9. A circuit according to claim 8 wherein at least one current source is coupled to supply current to at least two amplifiers of said plurality of said amplifiers.

10. A circuit according to claim 8 wherein said plurality of controllable amplifiers are formed in an integrated circuit.

11. A circuit according to claim 1:
wherein in addition to the series circuit consisting of at least three resistors there is provided at least one further series circuit of resistors connected in parallel with the said series circuit;
wherein a respective component whose resistance can be controlled is branched off between the resistors of said at least one further series circuit;
wherein said respective components are respectively connected to a further current source; and
wherein the current from the further current sources can be altered in dependence on said input voltage.

12. A circuit according to claim 1:
wherein in addition to the series circuit consisting of at least three resistors there is provided at least one further series circuit of resistors connected in parallel with at least one resistor of the first named series circuit of at least three resistor;
wherein a respective component whose resistance can be controlled is branched off between the resistors of said at least one further series circuit;
wherein said respective components are respectively connected to a further current source; and
wherein the current from the further current source can be altered in dependence on said input voltage.

* * * * *